(12) United States Patent
Silvestre

(10) Patent No.: US 6,476,563 B2
(45) Date of Patent: Nov. 5, 2002

(54) ELECTROLUMINESCENT ELEMENT

(75) Inventor: Guenole Claude Michel Silvestre, Dublin (IE)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/768,563

(22) Filed: Jan. 24, 2001

(65) Prior Publication Data

US 2002/0036471 A1 Mar. 28, 2002

(30) Foreign Application Priority Data

Jan. 25, 2000 (EP) ............................................ 00200258

(51) Int. Cl.$^7$ ................................................ G09G 3/10
(52) U.S. Cl. ...................... 315/169.3; 315/168; 349/144
(58) Field of Search ........................... 315/169.3, 169.1, 315/168; 349/143, 144, 147; 313/306, 309

(56) References Cited

U.S. PATENT DOCUMENTS

| | | | | |
|---|---|---|---|---|
| 4,678,282 A | | 7/1987 | Yaniv et al. ................ 350/334 |
| 5,260,818 A | * | 11/1993 | Wu ............................ 349/144 |
| 5,329,207 A | * | 7/1994 | Cathey et al. .............. 313/309 |
| 5,688,551 A | * | 11/1997 | Littman et al. ............... 427/64 |
| 5,937,272 A | * | 8/1999 | Tang ........................... 438/30 |
| 6,316,786 B1 | * | 11/2001 | Mueller et al. .............. 257/40 |

FOREIGN PATENT DOCUMENTS

WO WO9636959 11/1996

* cited by examiner

*Primary Examiner*—Haissa Philogene
(74) *Attorney, Agent, or Firm*—Aaron Waxler

(57) ABSTRACT

Dark spots in LED displays and illumination devices are prevented by adding redundancy in a LED display (illumination devices) by sub-pixelation and providing (a layer of) fuses for each sub-pixel. To this end, an electroluminescent element is characterized in that the electroluminescent element comprises a plurality of sub-elements in electrically parallel-arranged branches, and, in each branch, a fuse element between one of the connections and a part of the layer of electroluminescent material. The material of the electrode layer can then also be used as a material for the fuse element.

6 Claims, 2 Drawing Sheets

ELECTROLUMINESCENT ELEMENT

BACKGROUND OF THE INVENTION

The invention relates to an electroluminescent element having a transparent substrate which is provided with a layer of electroluminescent material between a first transparent electrode layer and a second electrode layer, and connections for the electrodes. The invention also relates to a display device with at least a pixel comprising such an electroluminescent element. The invention further relates to a radiation source, for example, an illumination source comprising such an electroluminescent element.

When used in a display device, an electric current flows from the first electrode layer to the second electrode layer during use, for example, within windows defined by a layer of insulating material. Dependent on the drive, the layer of electroluminescent material then luminesces in accordance with the windows defined in the layer of insulating material. Fixed patterns (icons or segments) can thus be displayed. It is alternatively possible to adapt the display device as a matrix display in which the layer of insulating material is usually absent. Pixels are then defined by overlapping parts of the first electrode layer and the second electrode layer. In the latter case, active drive is also possible.

The layer of electroluminescent material usually comprises a layer of organic material (for example, poly(p-phenylene vinylene) or PPV).

An electroluminescent element of the type described in the opening paragraph is used in the display device described in PCT application WO 96/36959 (PHN 15.320). In this display device, pixels are defined by the overlapping parts of the first and the second electrode layer. The layer of electroluminescent material comprises a semiconducting layer (active layer) and a hole-injecting electrode, which form diodes at the location of the pixels. During selection of a row of pixels, one or more diodes within a row convey current due to the presented drive signals, and luminesce. The light level is initially determined by the (adjustable) current through the pixel. Upon selection of a plurality of pixels within a row, a problem may occur when there is a short circuit within one of the pixels (or is caused during use) between the first and the second electrode layer. Since substantially all of the current now flows through the associated short-circuited diode, diodes associated with other pixels in the same selected row will not convey current or hardly convey current and will therefore not luminesce.

SUMMARY OF THE INVENTION

It is an object of the present invention to at least partly eliminate the above-mentioned problem.

To this end, an electroluminescent element according to the invention is characterized in that the electroluminescent element comprises a plurality of sub-elements in electrically parallel-arranged branches, and, in each branch, a fuse element between one of the connections and a part of the layer of electroluminescent material. The material of the electrode layer can then also be used as a material for the fuse element.

These and other aspects of the invention are apparent from and will be elucidated with reference to the embodiments described hereinafter.

BRIEF DESCRIPTION OF THE DRAWING

In the drawings:
FIG. 2 is an equivalent circuit diagram of one of the electroluminescent elements in FIG. 1, while

The Figures are diagrammatic and not drawn to scale. Corresponding pants are generally denoted by the same reference numerals

DETAILED DESCRIPTION OF THE PRIMARY EMBODIMENT

Figure 1:
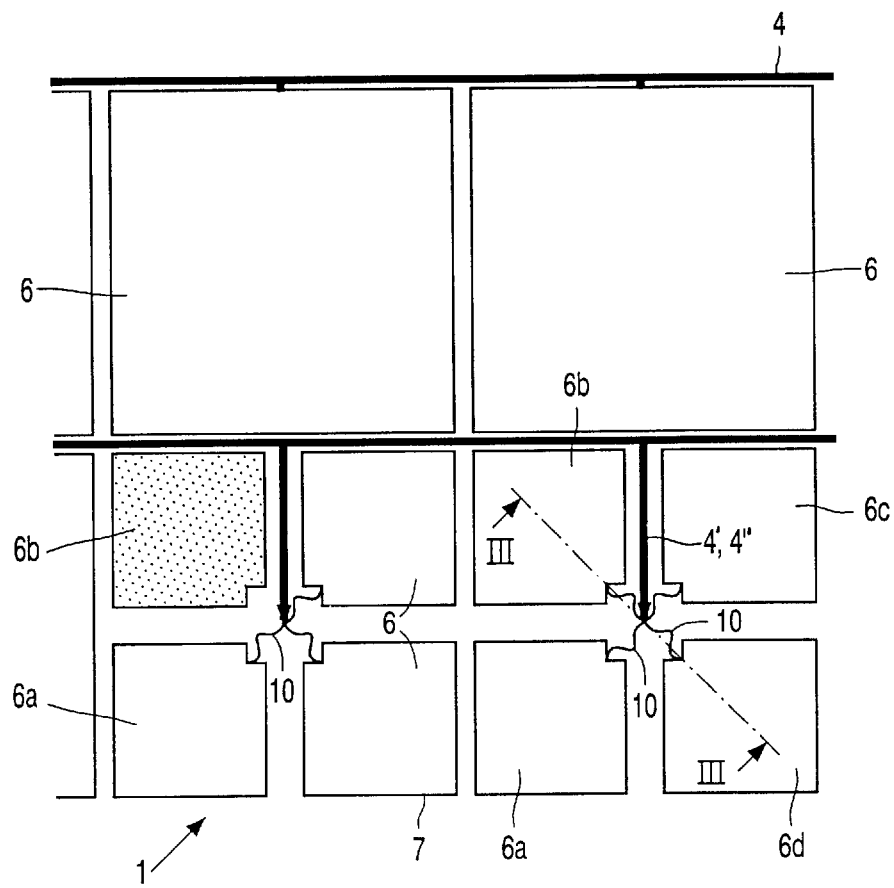
FIG. 1 is a plan view of electroluminescent elements (in a part of a display device) according to the invention.

FIG. 1 is a diagrammatic plan view of a part of a display device 1 (four pixels in this example). This device (FIG. 3) comprises a transparent substrate 2 of, for example, glass, a surface 3 of which is provided with a first, transparent electrode layer 4, in this example a conventional, about 150 nm thick structured layer of ITO (indium tin oxide). The ITO electrodes define parts of sub-pixels 6 and the tracks 4', 4". If necessary, the tracks 4', 4" are coated at suitable areas with a layer of low-ohmic material. A layer of electroluminescent material 8, for example, semiconducting organic electroluminescent material, is provided on the first electrode layer 4. In this example, the layer 8 is composed of two sub-layers $8^a$, $8^b$ of, for example, poly(p-phenylene vinylene) or PPV and polyethylene dioxythiophene (PEDOT). A second electrode layer 9 is provided on the layer of electroluminescent material.

The electrode layers 4, 9 and the intermediate eletroluminescent material 8 jointly constitute a light-emitting diode or LED in which, for example, the ITO layer 4 functions as an anode contact, while the electrode layer 9 functions as a cathode contact. In the plan view of FIG. 1, parts of the ITO tracks 4 extending horizontally between the pixels 6 constitute, for example, row electrodes, while column electrodes are constituted by vertically extending metal electrodes 9.

During selection, a row electrode receives a sufficiently negative voltage so that the LEDs driven via current sources have the desired current feedthrough within the same row, In this case, it may occur that one of the LEDs within the row has a short circuit. Without special measures, substantially all of the current then flows through the relevant LED and the complete row will then remain dark, even when other LEDs should receive current from the associated current sources.

Figure 3:
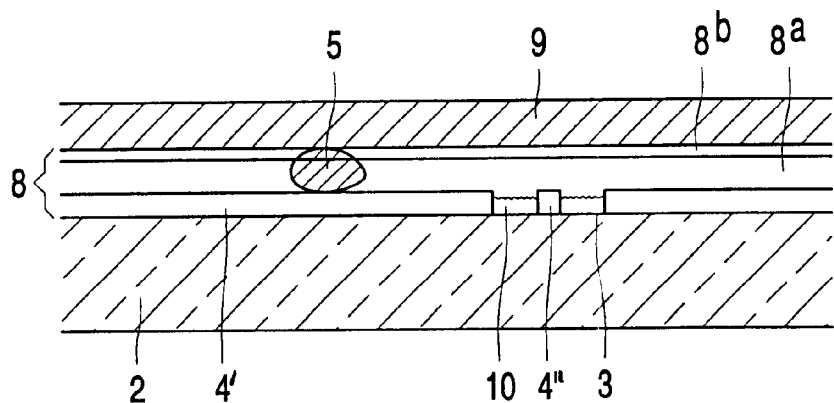
FIG. 3 is a cross-section taken on the line III—III in FIG. 1.

According to the invention, this is prevented by dividing the pixels into a plurality of sub-pixels $6^a, 6^b, 6^c, 6^d$ (four in this example) in parallel-arranged branches, with a fuse element 10 in each branch, in this example between row electrode 4 and the layer of electroluminescent material 8 associated with the sub-element. The fuse elements 10 as well as the row electrodes and the actual cathodes are preferably made of the same material, for example, ITO. In this respect, it is to be noted that the cross-section of FIG. 3 shows the ITO layer at the location of the fuse element 10 as one continuous whole, whereas it may have an S shape or another suitable shape in a plan view (as shown in, for example, FIG. 1). To function as a fuse element, the cross-section of the ITO tracks 10 will be smaller than that of the ITO connection conductors 4',4". It is essential that the fuse elements 10 are the first to blow. If necessary, the part of the ITO layer not associated with the fuse element may be coated with a layer,of low-ohmic material for this purpose.

Figure 2:
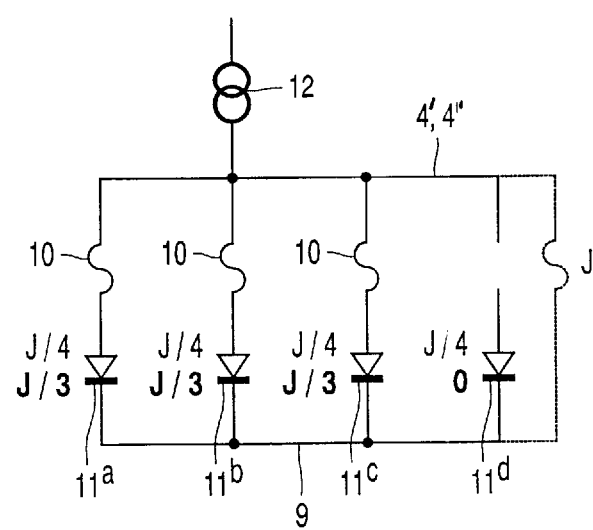

The complete pixel 6 can now be presented, as it were, as a parallel arrangement of four sub-LEDs 11$^a$, 11$^b$, 11$^c$, 11$^d$ (see FIG. 2). Since such pixels are often driven via current control, diagrammatically shown by means of a current source 12, a current J will spread during operation across the four parallel-arranged branches (J/4 in each branch). When a short circuit 5 occurs between the ITO layer 4 and the cathode layer 9, the associated fuse element 10 will be blown by the current peak in the associated branch (the branch with sub-LED 11$^d$ in this example) and the current (now represented by J) will be spread across the three remaining parallel-arranged branches (now J/3 in each branch 11$^a$, 11$^b$, 11$^c$ and 0 in branch 11$^d$). In this case, J is much larger than J because a current of other pixels also flows in the same row due to the short circuit. In a segment display, J is the total current through the segment (J=J). Due to the measure, not only the remaining pixels in the same row will continue to luminesce in the case of a short circuit, but the pixel affected by the short circuit will also luminesce with substantially the same luminance.

Figure 4:
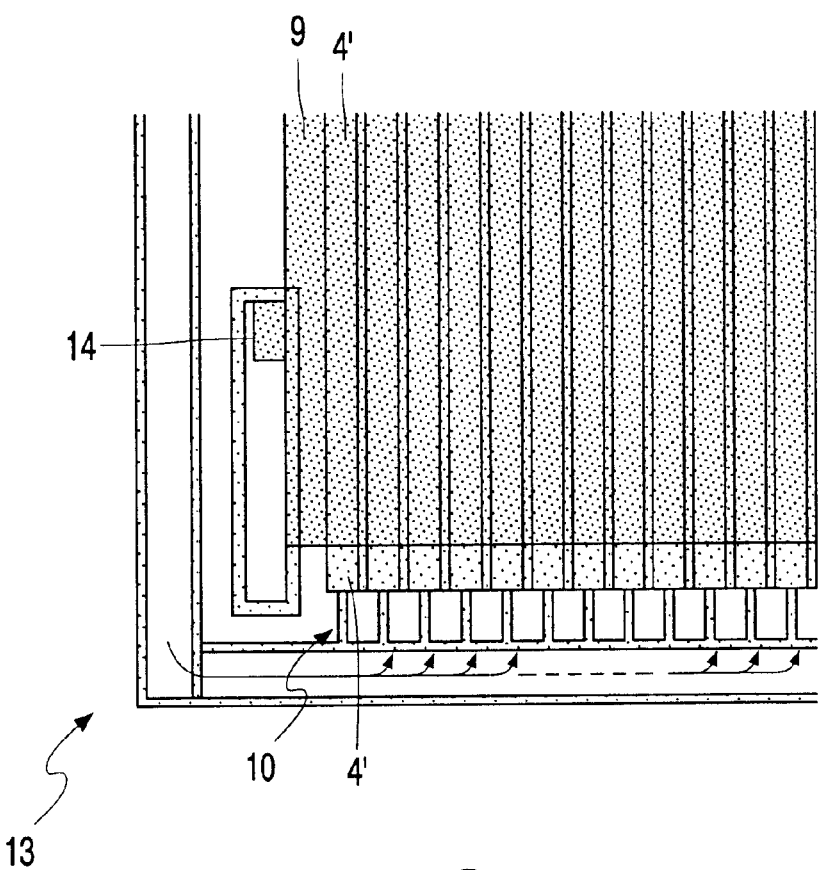
FIG. 4 is a plan view of electroluminescent elements (in a part of an illumination source) according to the invention.

FIG. 4 is a diagrammatic plan view of a radiation source, notably an illumination unit 13. Separate anode parts 4" in this example of a transparent material such as ITO, are again connected to a connection electrode 4 via filse elements 10. The luminescent material is present between these anode pans and a cathode layer 9 which is contacted via a connection 14.

In the case of a short circuit between such an anode part, 4" and the cathode layer 9, only the portion at the location of anode part 4" drops out due to blowing of the associated fuse element 10. The total light intensity does not substantially change.

Several variations are possible within the scope of the invention. Instead of being realized in the anode material, the fuse element may also be realized between the cathode and the sub-elements (for example, in the cathode material). Provisions for blowing the fuse may be made in the drive which temporarily sends a high current through selected pixels and causes the associated fuse elements to blow. A fixed pattern can thereby be adjusted in advance. Instead of being adapted for visible light, the radiation source may alternatively be adapted for, for example, emitting infrared radiation, for example, for security purposes.

The protective scope of the invention is not limited to the embodiments described. The invention resides in each and every novel characteristic feature and each and every combination of characteristic features. Reference numerals in the claims do not limit their protective scope. Use of the verb "to comprise" or its conjugations does not exclude the presence of elements other than those stated in the claims. Use of the article "a" or "an" preceding an element does not exclude the presence of a plurality of such elements.

What is claimed is:

1. An electroluminescent element having a transparent substrate which is provided with a layer of electroluminescent material between a first transparent electrode layer and a second electrode layer, and connections for the electrodes, characterized in that the electroluminescent element comprises a plurality of sub-elements in electrically parallel-arranged branches and, in each branch, a short-circuit fuse element between one of the connections and a part of the layer of electroluminescent material.

2. An electroluminescent element as claimed in claim 1, characterized in that the fuse element and an electrode layer are made of the same material.

3. A display device with at least one pixel, characterized in that the pixel comprises sub-pixels, which sub-pixels comprise an electroluminescent element as claimed in claim 1.

4. A display device as claimed in claim 3, characterized in that electrode layers associated with the sub-pixels are coupled to drive electrodes of the display device.

5. An illumination source comprising an electroluminescent element as claimed in claim 1.

6. A display device as claimed in claim 3, characterized in that the display device comprises a current source which, in the operating condition, can supply sufficient current to cause all fuse elements associated with a pixel to blow.

* * * * *

UNITED STATES PATENT AND TRADEMARK OFFICE
CERTIFICATE OF CORRECTION

PATENT NO.     : 6,476,563 B2
DATED          : November 5, 2002
INVENTOR(S)    : Guenole Claude Michel Silvestre It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-fifth Day of March, 2003

JAMES E. ROGAN
*Director of the United States Patent and Trademark Office*